United States Patent
Seeliger et al.

(10) Patent No.: US 6,317,053 B1
(45) Date of Patent: Nov. 13, 2001

(54) SWITCH CABINET WITH A FIRE EXTINGUISHING SYSTEM

(76) Inventors: Hans-Dieter Seeliger, Sandstrasse 18, Mülheim D-45468; Uwe Kühn, Schaumbeckstrasse 8, Mülheim D-45481, both of (DE)

( * ) Notice: Subject to any disclaimer, the term of this patent is extended or adjusted under 35 U.S.C. 154(b) by 0 days.

(21) Appl. No.: 09/380,829

(22) PCT Filed: Feb. 28, 1998

(86) PCT No.: PCT/DE98/00639

§ 371 Date: Sep. 10, 1999

§ 102(e) Date: Sep. 10, 1999

(87) PCT Pub. No.: WO98/40858

PCT Pub. Date: Sep. 17, 1998

(30) Foreign Application Priority Data

Mar. 11, 1997 (DE) .............................. 197 09 683
Feb. 26, 1998 (DE) .............................. 198 07 804

(51) Int. Cl.$^7$ .................................. G08B 23/00
(52) U.S. Cl. .................... 340/693.5; 169/46; 340/289; 340/693.6
(58) Field of Search ................. 340/693.5, 693.6, 340/693.9, 693.12, 289; 169/46, 47, 49; 307/117; 361/103

(56) References Cited

U.S. PATENT DOCUMENTS

| 3,403,733 | * 10/1968 | Terry ...................................... 169/49 |
| 4,630,037 | * 12/1986 | Escamilla, Jr. ........................ 340/628 |
| 5,537,096 | * 7/1996 | Wagner .............................. 340/693.6 |
| 5,845,714 | * 12/1998 | Sundholm ............................. 169/46 |
| 5,990,789 | * 11/1999 | Berman et al. ..................... 169/49 X |

FOREIGN PATENT DOCUMENTS

| 3433459 | * | 3/1986 | (DE) . |
| 4323730 | * | 1/1995 | (DE) . |
| 4343887 | * | 6/1995 | (DE) . |
| 459 944 | * | 5/1991 | (EP) . |
| 02433 | * | 1/1995 | (EP) . |
| 2360321 | * | 3/1978 | (FR) . |
| 2523455 | * | 9/1983 | (FR) . |

OTHER PUBLICATIONS

Pat. Abstracts of Japan, No. 09135919, "Super–Sensitive Fire Detection/Extinguishing System", vol. 97, #9, May 1997.*

Striewisch, "Argon, Ein Ersatz Fuer Halon", *Protector*, vol. 19, No. 5, pp. 9–10, 12–13, Nov. 1991.*

* cited by examiner

*Primary Examiner*—Thomas Mullen
(74) *Attorney, Agent, or Firm*—James Creighton Wray; Meera P. Narasimhan

(57) ABSTRACT

A switch cabinet is provided for protection of servers and other highly sensitive computer devices or miscellaneous equipment. The cabinet is configured as a protection cabinet with an interior isolated from the atmosphere. The interior is continuously provided with fresh air by a ventilator. Fresh air is controlled by early detection fire sensors shortly before passing through the ventilator. When fire breaks out, the early detection fire sensors activate gas bottles filled with the noble gas argon, so that argon can be introduced into the interior to extinguish the fire once fresh air supply has been stopped, thereby ensuring early and fast extinguishing of the blaze.

20 Claims, 2 Drawing Sheets

FIG. 5
FIG. 6
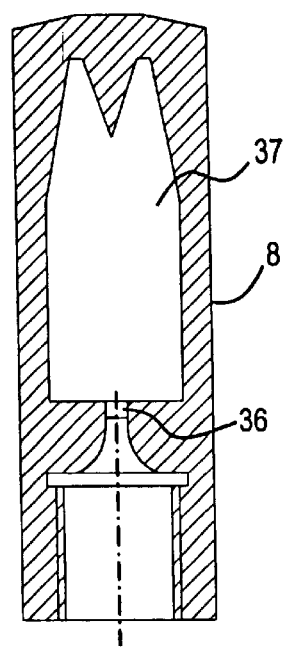
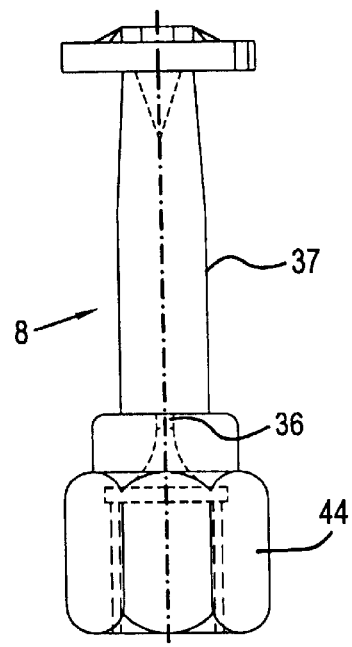
FIG. 7
FIG. 8
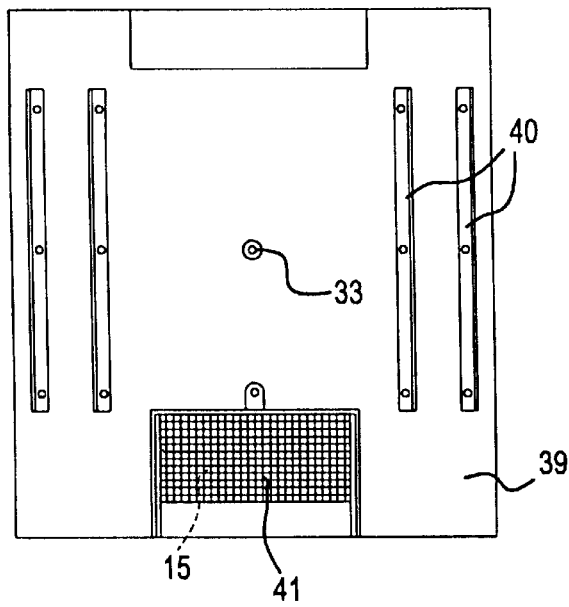
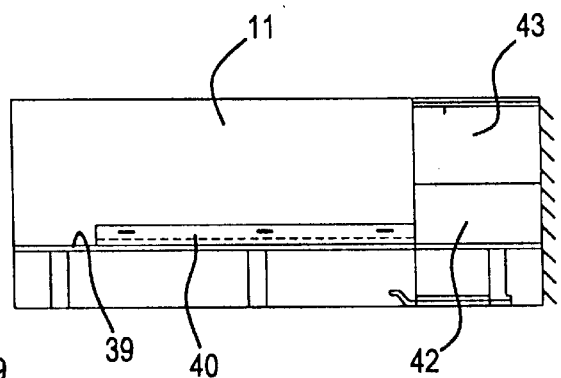

SWITCH CABINET WITH A FIRE EXTINGUISHING SYSTEM

BACKGROUND OF THE INVENTION

The invention concerns a switch cabinet for servers and similar devices, particularly parts of sensitive computer devices, whose interior area is connected to gas bottles containing fire extinguishing gas and is continuously supplied with fresh air via a ventilator, with early fire detection sensors being switched into the exhaust air current outside of the interior area and the connection being activated in case of fire.

Switch cabinets serve the purpose of housing equipment and devices with which entire systems or groups of machines can be controlled and operated. Suitable switch cabinets can also house servers and other highly sensitive computer devices to which access by unauthorized personnel is to be denied and which, at the same time, are to be protected from other influencing factors, sometimes even of climatic kind. Beyond this, it is known to install in switch cabinets appropriate devices and equipment that can auto ignite and thus place themselves, but also their environment, at risk. Attempts are made to deoxidize the possibly occurring flame with inert gas. Appropriate switch cabinets and similar devices, however, have so far not been able to conquer the market due to the extensive amount of work that is involved.

From DE-OS 34 33 459, a device for early detection of fires and of overheating on housings and cabinets that enclose electric or electronic systems is known. For this, smoke detection occurs immediately at the air exhaust vent of the unit that is being monitored, e.g. with the help of an intake funnel. It also presents a device used to monitor electric equipment with regard to fire protection. FR 523 455 describes a switching system for a combined smoke alarm and fire extinguishing unit, which however unfortunately releases a fire-extinguishing agent, preventing the devices installed in the cabinet from being used any further. EP 459 944 suggests the utilization of carbon dioxide as a fire-extinguishing agent in order to be able to effectively handle only the system affected by the fire and thus limit fire and extinguishing damage to a minimum. For this, a fire detector is provided for in the warm air current of the system that is to be protected as well as an outlet orifice of the container with the fire-extinguishing agent within the housing of the system. With this design, however, lacking reliability of this control system proved to be disadvantageous because no samples are actively collected and no prompt or satisfactory fire-extinguishing procedure occurs in case of fire. Generated smoke reaches the fire detectors more or less by accident, which then triggers the release of carbon dioxide. The carbon dioxide then pushes oxygen out of the system through orifices until the flame has been extinguished. Subsequent fires cannot be prevented.

SUMMARY OF THE INVENTION

The invention is therefore based on the task of creating a switch cabinet that protects a server or similar highly sensitive computer parts and which ensures that, in case of fire in the interior, the fire is extinguished in a manner that is neutral or protective to stored data, occurs autonomously and reliably, and that at the same time prevents subsequent fires from flaring up.

According to the invention, the task is resolved by the fact that the interior is represented by a protective cabinet that is closed off from the atmosphere, that the gas bottles which are activated via the early fire detection sensors in case of fire are filled with the noble gas argon, that the interior is connected to the atmosphere via a supply tube which is equipped with an intake and exhaust air nozzle combination with screen on the end located outside the protective cabinet, and that the early fire detection sensors and the entire control system are assigned to an additional cabinet that is allocated to the protective cabinet.

This offers the opportunity of monitoring the protected switch cabinet continuously and to flood it fully automatically in the case of fire with a quenching gas, i.e. preferably with a harmless inert gas that does not pollute the environment. Due to the early fire detection sensors and the appropriate control system, the fire-inhibitory atmosphere can be maintained for a certain period of time, e.g. 20 minutes, so that by the end of that time period the fire can certainly be extinguished and the cabinet can subsequently be entered or inspected for repairs. The quenching gas argon that is utilized is generally recognized as being completely safe as a normal component of the atmosphere, but contrary to other gases offers the great advantage of eliminating cold shock, which is generated with other gases such as carbon dioxide. The highly sensitive electronic components installed in the area that is to be extinguished are therefore affected neither by moisture nor by a change in temperature during the extinguishing procedure. In this way, a beneficial double-effect is achieved, apart from the fact that the continuous feeding of fresh air during normal operation offers the benefit of maintaining a certain temperature within the switch cabinet so that negative influencing factors on the highly sensitive electronic components cannot occur even during operation. Additionally, it proves advantageous that areas of the systems which are not affected by the fire remain functional. With appropriate controls, exactly those parts that enable immediate start-up upon quenching or extinguishing of the fire can be operated. And finally it proves beneficial that the rooms in which the switch cabinets are installed remain accessible to employees.

A particularly compact version of an appropriately secured switch cabinet is possible if the early fire detection sensors and the entire control system are assigned to the protective cabinet. This additional cabinet can then be arranged in such a way that both air supply as well as air outlets are particularly pleasant for employees; however, a very compact design is especially possible when the additional cabinet has been adjusted to the upper part of the protective cabinet, and also houses the ventilator and is connected to the upper part. This design furthermore offers the advantage of easy retrofitting because only a few bores have to installed into the wall for the wires and tubes, which are required with regard to electronics as well as for air supply.

For recognition of a fire, only slight air supply or appropriate suction is required so that the ventilator does not require much space and only little energy. It is useful when the ventilator is set on suction during regular operation and stopped by the control system in case of fire. The connection, i.e. the line in the wall, would then be closed so that neither additional air can be sucked out through the ventilator nor can air enter through the orifice. Through appropriate control of the ventilator, the early fire detection sensors can be installed relatively close to the ventilator and thus outside the actual switch cabinet in order to be able to check air sucked out through the ventilator accordingly and to turn on appropriate units immediately, upon detection of fire.

A distinct feeding process of air sucked out through the ventilator occurs by connecting the interior with the atmosphere via a supply tube, with the tube being equipped with an intake and exhaust nozzle combination with screen at the end located outside the protective cabinet. During normal operation, the ventilator sucks air in through the intake nozzle, and the air is then guided into the lower area of the switch cabinet through the supply tube and flows upward from there. In doing so, it flows through practically all parts of the interior area, e.g. of the server, so that it carries possible traces of occurring fires to the outside of the switch cabinet already during their break-out phase, from where the early fire detection sensors are responsible for appropriate processing. At the same time, this intake nozzle can also be utilized as an air exhaust nozzle during fires because then the noble gas argon is pushed into the interior via an appropriate nozzle and then passed to the outside via the supply tube or an intake tube and the air exhaust nozzle. By feeding new argon gas continuously via the supply tube, prompt flooding of the switch cabinet's interior is ensured, with the fire-inhibitory atmosphere being guaranteed by the continuous supply of argon. Harmful fire gases are removed via the intake tube together with the argon gas and can therefore cause no damage in the cabinet. In order to ensure an additional exhaust area during the intake of air also throughout the entire length of the intake tube, several bores are provided for throughout the intake tube's length apart from the orifice in the side of the cabinet, i.e. in the area of the cabinet's bottom. Fresh air is fed to lower part of the cabinet via the supply tube and is then again removed by the extractor fans of the extinguishing system in the upper area of the cabinet. This results in complete ventilation of the interior and thus also in the guaranteed transportation of fire or smoke particles to the sensor systems installed behind the extractor fans.

The compact design of the switch cabinet with the additional cabinet has been pointed out above; this design enables the formation of a connection between the gas bottles and the switch cabinet in the form of conduits, with these conduits ending in the covering wall of the protective cabinet in the form of a high pressure gas nozzle. This high pressure gas nozzle initially ensures that the entering noble gas argon is distributed evenly and beyond that roughly maintains the temperature within the switch cabinet in order to avoid the above-mentioned disadvantages caused by cold shock.

The distinct distribution and treatment of argon is ensured particularly by the fact that the high pressure gas nozzle is designed to include a warm-up outlet and a relaxation and distribution chamber. Initially the argon gas is compressed in the area of the warm-up outlet and thus heated so that it can flow into the switch cabinet's interior at an appropriate temperature. It is then evenly distributed in the distribution chamber in such a way that it quickly reaches all areas of the switch cabinet and ensures the extinguishing of a possibly occurring fire.

Another useful version is represented by a design in which the additional cabinet is equipped with mounting devices for the gas bottles on the upper side. This also provides for a short path from the gas bottle to the high pressure gas nozzle, which not only ensures rapid availability, but also guarantees that the argon required for extinguishing is available at a very early stage due to the short tubes or connecting lines. Additionally, this design results in a very compact layout of the entire switch cabinet with the additional cabinet on top.

The protection of data is a major problem especially with servers and similar devices. With special interpretation electronics that are coupled with the active multiple-sensor technology for early fire detection, however, it is possible to protect all data when a fire is about to develop or during another dangerous situation in such a way that the data is no longer at risk. This can be achieved especially when installing at least two early fire detection sensors that have different switching times, with the one having the shorter switching time being connected to the control system and the server or data protection device and the one having the longer switching time being connected to the control system and the extinguishing area. This ensures that initially all important data is stored upon recognition of an imminent or occurring fire so that existing data becomes available again even when the server or other parts are subsequently placed at risk. It is not until this process has occurred that the extinguishing area is activated and the extinguishing process takes place accordingly. The extinguishing process can, of course, be initiated parallel to this procedure in order to keep the time frame as short as possible. Overall, this process takes place within just a few seconds or minutes in any case.

It has already been pointed out that the rooms in which appropriate switch cabinets are located continue to be accessible to employees even in the case of fires that occur in the switch cabinet. This also ensures that help is available quickly in case of fire, with this procedure being even optimized by designing the control system simultaneously as a fire alarm and connecting it with the extinguishing area and a fire alarm center. This means that not only the extinguishing process is initiated via the control system, but also that simultaneously the fire is reported to a center so that additional safety and aid measures can be introduced.

In order to be protected from all possibilities, the design provides for the control system and/or the additional cabinet to be assigned a power failure device that is operated manually.

The invention is particularly distinguished by the fact that a switch cabinet has been created that can protect a server or similar highly sensitive computer devices, but can also incorporate other important switching elements in order to protect them from access by unauthorized personnel on the one hand, while simultaneously protecting them from possible drastic climate changes or other influences, but also above all to protect them from fires occurring in parts of the entire system or the switches. Initially, this is achieved by a closed atmosphere in which the appropriate switches and switch-like parts are located and which also ensures that, in case of fire, disconnection is possible by flooding it with argon as inert gas. With argon the fire would then be extinguished within a short time so that the cabinet and parts contained in it are accessible again. Early detection of the occurring fire is enabled by introducing fresh air continuously into the closed-off area, i.e. the interior, and then vacuuming it off again, with early fire detection sensors in the suction current ensuring that appropriate activities are initiated at a very early stage in the case of occurring fires. This means that not only the flooding process with argon is initiated, but also that at the same time or even before, data is subjected to a protection process so that in case of fire not only can the fire be addressed promptly, but also that damage can largely be minimized early on. It is also beneficial that the inert gas extinguishing process does not cause any harm because the fire extinguishing agent, i.e. argon gas, is harmless not only to the environment, but also to the parts and devices on which the fire is extinguished. Early fire detection sensors ensure detection within a few seconds and appropriate introduction of extinguishing measures. The rooms in which the protective cabinets are located remain accessible to employees, the required fire extinguishing system together with the switch cabinet has a compact design, and the regulation, according to which those parts necessary for the introduction of extinguishing measures shall remain outside the switch cabinet, has been adhered to. Appropriate energy supply offers the opportunity of having a self-sufficient system up to 72 hours even in case of power failure. Also beneficial is the plain text operator prompting system and the report output system, and beyond that remote diagnosis becomes possible upon inquiry via existing data networks. By switching the server or the other switches at an early stage and into a switch position that allows renewed operation shortly after completion of the fire extinguishing efforts, overall damage can be kept low.

Further details and advantages of the invented object are presented in the following description of the appropriate drawings, which show a preferred version with the necessary details and individual parts. They show;

DETAILED DESCRIPTION

Figure 1:
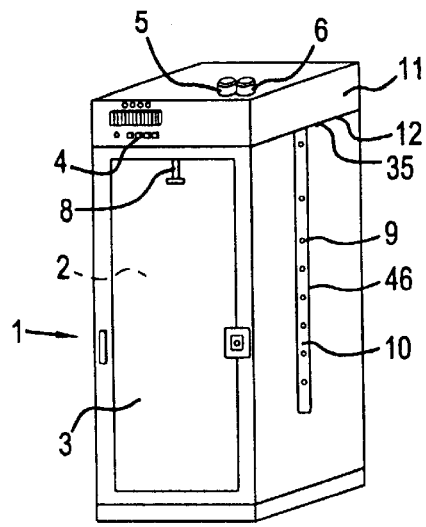
FIG. 1 a perspective view of a switch cabinet, in part with depiction of parts that are installed in the interior, which is basically not visible, FIG. 2 a switch cabinet during normal operation and FIG. 3 a switch cabinet while being fed argon during fire, FIG. 4 a functional diagram of an appropriate switch cabinet, FIG. 5 a sectional view of a high pressure gas nozzle, FIG. 6 a side view of the appropriate nozzle, FIG. 7 a top view onto the additional cabinet, and FIG. 8 a sectional view of the additional cabinet.

FIG. 1 shows a switch cabinet that is designed as a protective cabinet 1. This means that it is equipped with a larger interior area 2 that is secured from the outside atmosphere. The interior is accessible via the cabinet door 3, with a large indicator panel 4 being provided for in the upper area which enables plain text operator prompting.

The upper part of the protective cabinet 1 is assigned an alarm horn 6 and an alarm lamp 5. FIG. 1 indicates supply tubes 7 and a high pressure gas nozzle 8 reaching into the interior 2, via which a noble gas, argon in this case, can be pushed into the interior 2.

Figure 2:
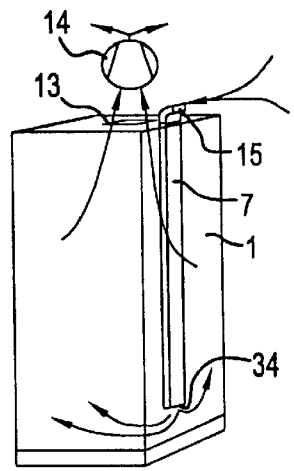

The intake tube 46 is equipped with several bores 9, 10, which are distributed across the entire length of the tube and ensure that incoming air—as indicated in FIG. 2—can also flow into the interior 2, distributed across the length of the supply tube 7.

The indicator panel 4 with the appropriate plain text operator parts is assigned to an additional cabinet 11 that is placed on top of the protective cabinet 1, with the additional cabinet 11 being connected to the upper part 12 of the protective cabinet 1.

Figure 4:
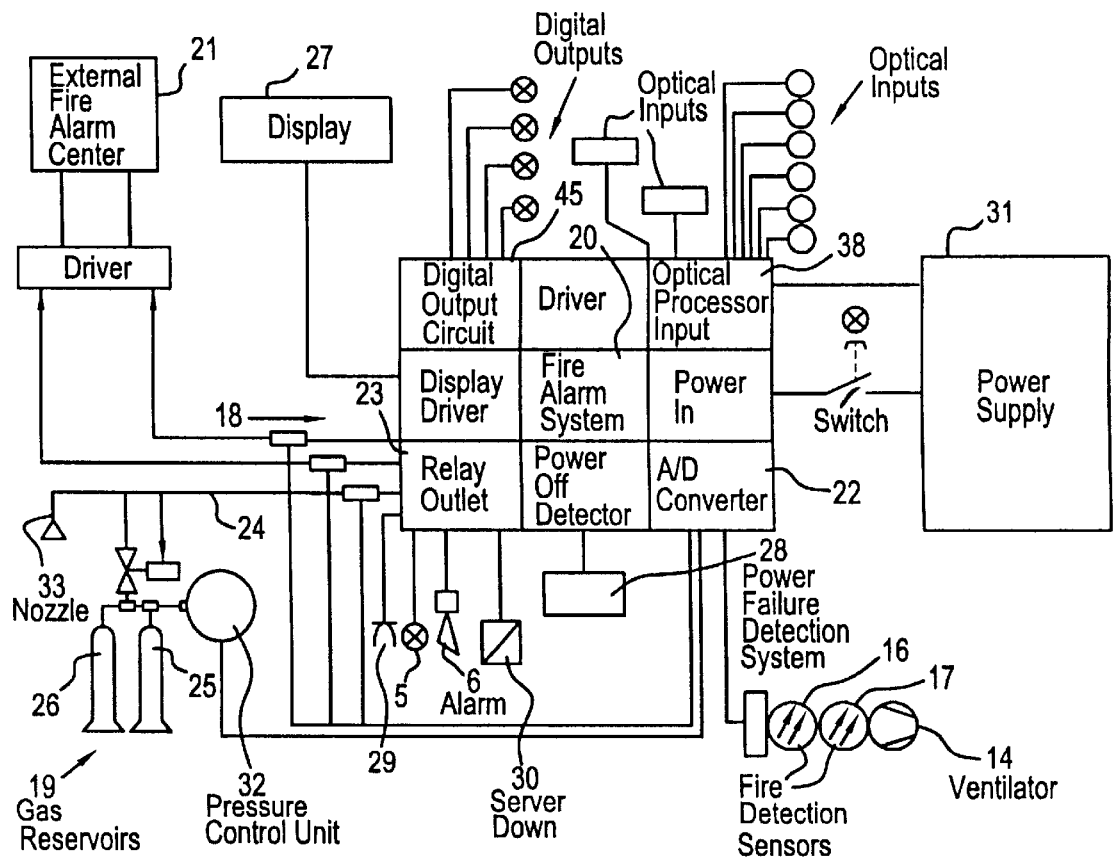

FIG. 2 depicts normal operation of such a protective cabinet 1, with fresh air being pulled into the interior 2 via the nozzle 15. To accomplish this, the supply tube 7 is hooked up to a connector that protrudes from the protective cabinet 1 or the additional cabinet 11 and which is assigned an intake and air outlet nozzle 15. In the example shown in FIG. 2, air is taken into the supply tube 7 via the intake nozzle 15 and into the interior 2 from there in order to flow through the interior 2 and be vacuumed off at the upper end by the ventilator 14. FIG. 4 indicates that several early fire detection sensors 16, 17 are installed in the area of the ventilator 14. One of these early fire detection sensors 16 is designed in such a way that it connects earlier than the second early fire detection sensor 17, and that it initially connects to the server so that appropriate data can be secured. It is not until the second early fire detection sensor 17 has been activated that the additional control system 18 and the extinguishing area 19 are connected.

Figure 3:
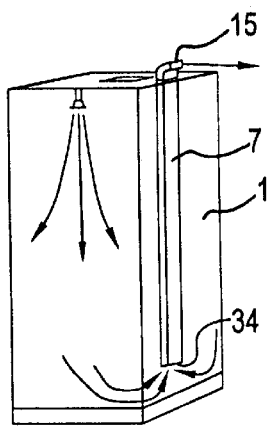

The solution addressed here is initiated when the early fire detection sensors 16, 17, which are installed in front of the ventilator 14, trigger appropriate control processes. The opening 13 indicated in FIG. 2 is then closed off and at the same time the connection to the gas bottles 25, 26 shown in FIG. 4 is created so that via the connection 33 argon can flow into the interior 2 via the high pressure gas nozzle 8. Argon is produced through the plate-distillation of liquefied air and utilized also, among other things, in considerable quantities as inert gas during electric welding as well as during the processing of some metals, e.g. titanium. Argon also occurs in the air. It is completely harmless to the environment. It can therefore leave the protective cabinet 1 without problems via the air exhaust nozzle, or preferably the argon outlet nozzle 15, after flowing through the interior 2 of the protective cabinet 1. This is also depicted in FIG. 3. FIG. 4 shows a functional diagram, and it was pointed out above that the ventilator 14 with the early fire detection sensors 16, 17, which are located in front of it, are indicated here. The control system 18, which is located behind the ventilator, simultaneously serves as a fire alarm system 20 and is connected to a fire alarm center 21 so that the center is also informed within the shortest possible time in case of fire. The appropriate signals are converted accordingly by the A/D converter 22 and forwarded to the relay exit 23 from where at first the switching position 30 Server Down is initiated and then the switching position 29 Server Off. At the same time, the alarm horn 6 and the alarm lamp 5 are addressed so that information is secured all the way around. On the display 27 appropriate information can also be seen, as would be the case if the entire system had been switched on manually via the power failure system 28.

The power supply unit 31 is meant to ensure that the system will operate completely self-sufficiently even over long periods of time, e.g. 72 hours, after a power failure has occurred.

The gas bottles 25, 26, which are supplied with appropriate commands via the connecting line 24, can be seen on the left outer edge of the functional diagram. Should this case occur, appropriate valves are opened, and argon gas can flow out of the gas bottles 25, 26 and the connection 33 towards the switch cabinet and protective cabinet 1. The quantity of the extinguished agent (argon) that is available in the gas bottles 25, 26 is monitored by the pressure/content ratio with the help of a calibrated piston switch 32. The opening of the supply tube 7 on the cabinet side is marked 34, and it is located near the bottom of the protective cabinet 1. The covering wall, into which the high pressure nozzle 8 out of which argon flows into the interior 2 in case of fire is inserted, is marked 35.

Such a high pressure gas nozzle 8 is shown in FIGS. 5 and 6, and we would like to mention that the high pressure gas nozzle 8 fulfills a dual function, i.e. with its warm-up outlet 36 it ensures that the gas is not cooled off additionally, and with the large distribution chamber 37 it ensures that gas is distributed evenly throughout the interior 2 of the protective cabinet 1.

FIG. 4 indicates additional functions so that authorization can be checked, the horn can be turned off or other malfunctions can be eliminated via the relay 38. This means that additional functions can be carried out in this way. On the opposite side, the outlets 45 with regard to the appropriate information on operation, malfunction, alarm and feedback to the fire alarm center 21 are indicated.

FIGS. 7 and 8 display the top view of the additional cabinet 11, showing that here on the upper side 39 mounting devices 40 for gas bottles 25, 26 can be provided for in order to design the entire system as compactly as possible. The intake and air outlet nozzle 15 is secured by a screen 41, with all parts being easily removable from the upper side 39 due to screw assemblies.

FIG. 8, lastly, shows a sectional view of the additional cabinet 11, again displaying mounting devices 40, but also the ventilator chamber 42 and sensor chambers 43 that are installed on the side. The lower part of the high pressure nozzle 8 is marked 44; it is a screw assembly in order to facilitate screwing in the nozzle.

The compact protective cabinet 1 with additional cabinet 11 can be manufactured and offered in different variations with differing gas volumes, which means that appropriate fire protection can be taken into consideration in the planning of new switch cabinets without any problems. Also the retrofitting of existing switch cabinets is possible with little installation effort.

An integrated process control system can establish a connection with an external computer system with the help of the data interface. All alarm, status and error functions of the secured switch cabinet can be recalled via this data interface. Furthermore, the operating program that runs on the process computer within the protective cabinet 1 is also loaded via this interface. During maintenance, installation or repairs, the individual steps of the maintenance, installation or repair procedures are recorded with the help of a specially developed computer program, which runs on an external computer system. The external computer program communicates with the protective cabinet 1 via the data interface and verifies the responses provided by maintenance personnel to questions posed by the program regarding the procedure of the maintenance or repair work. All data gathered this way is recorded by the computer program in a data base so that the complete history of all work performed on the protective cabinet 1 can be recreated. This measure serves the purpose of operating safety of the protective cabinet 1. All work that has been performed is then summarized in a work log, which is printed automatically with the help of the computer program upon completion of the work.

Several of the systems described above can be connected to each other with a specially designed communication bus. The protective cabinets 1 secured with these kinds of systems are then connected to each other into a protective area. One of the systems, the master system, is then equipped with the control and information processing system. With the communication bus, all status, alarm and error information of the coupled systems is reported to the central unit. The number of coupled systems is limited only by the possibility of transmitting differing information via the communication bus. The communication bus can be designed in different ways. Both a cable-connected and a cableless information transmission set-up are provided for.

The components of the device described above can also be designed in such a way that individual components can exist several times. These components are then connected to the base protective cabinet 1 via cables or other connections and thus enable simple expansion of the system's functionality. It would then e.g. be possible to increase the capacity of the supply of extinguishing agent in the (high pressure) gas bottles 25, 26 or to increase the quantity of cooling air fed to the protective cabinet 1.

Additionally, for the purpose of monitoring fire residue in the escaping air of the protective cabinet 1, additional physical data can also be monitored. Simultaneously with detection of the fire, values regarding temperature, humidity and power consumption of the protective cabinet 1 are determined with appropriate sensors and can then be transmitted for further processing via the above-described data interface or processed by the process control system of the entire system. This additionally gained data then enables e.g. the control of air supply of the protective cabinet 1 that is monitored, or the triggering of an alarm of the operating personnel once preset values have been reached.

All features that have been quoted, including those that are only referenced in the drawings, are regarded as distinct features of the invention, either by themselves or in combination with each other.

What is claimed is:

1. Switch cabinet apparatus for devices comprising a protective cabinet sealed-off from the atmosphere having an interior, containers connected to the interior, fire extinguisher provided in the containers, a ventilator connected to the cabinet for continuously removing fresh air from the interior, an exhaust connected to the interior, and early fire detection sensors installed in the exhaust outside the interior for detecting fires and for activating release of the fire extinguisher from the containers.

2. The apparatus of claim 1, further comprising a supply tube connecting the interior to the atmosphere.

3. The apparatus of claim 2, wherein the supply tube comprises an intake and an exhaust air nozzle combination.

4. The apparatus of claim 1, further comprising a screen located at an end outside the protective cabinet and a control system connected to the cabinet and the sensors.

5. The apparatus of claim 4, further comprising an additional cabinet communicating with the protective cabinet, wherein the control system and the early fire detection sensors are located in the additional cabinet.

6. The apparatus of claim 5, wherein the additional cabinet is in an upper part of the protective cabinet and wherein the ventilator is connected to the upper part.

7. The apparatus of claim 6, wherein the additional cabinet is connected to the interior via an intake tube, and wherein the intake tube comprises plural bores throughout a length of the intake tube.

8. The apparatus of claim 5, further comprising mounting devices in the additional cabinet for mounting the containers on an upper side of the protective cabinet.

9. The apparatus of claim 4, further comprising a suction system connected to the ventilator, wherein the suction system is on during normal operation, and wherein the control system inactivates the suction system in case of fire.

10. The apparatus of claim 4, wherein the control system includes a fire alarm device connected to a fire extinguishing part and a fire alarm center.

11. The apparatus of claim 10, further comprising a power failure alert system communicating with the control system.

12. The apparatus of claim 11, wherein the alert system is further connected to the additional cabinet.

13. The apparatus of claim 11, wherein the alert system is manually operable.

14. The apparatus of claim 1, wherein the containers are gas bottles, and wherein the fire extinguisher in the containers is a noble gas.

15. The apparatus of claim 14, wherein the noble gas is argon.

16. The apparatus of claim 1, wherein the devices include servers and sensitive computing devices.

17. The apparatus of claim 1, further comprising a conduit connecting the containers and the protective cabinet, and a high pressure nozzle provided on an end of the conduit which ends in a covering wall of the protective cabinet.

18. The apparatus of claim 17, wherein the high pressure nozzle comprises a warm-up outlet, and a relaxation and distribution chamber.

19. The apparatus of claim 1, further comprising at least two early fire detection sensors with different switching times.

20. The apparatus of claim 19, wherein the at least two different sensors include one sensor having shorter switching times being connected to the control system and the devices, and another sensor having longer switching times being connected to the control system and the containers having the fire extinguisher.

* * * * *